US010756183B2

(12) United States Patent
Then et al.

(10) Patent No.: US 10,756,183 B2
(45) Date of Patent: *Aug. 25, 2020

(54) N-CHANNEL GALLIUM NITRIDE TRANSISTORS

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Beaverton, OR (US); Sanaz K. Gardner, Portland, OR (US); Seung Hoon Sung, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/041,657

(22) Filed: Jul. 20, 2018

(65) Prior Publication Data

US 2018/0350911 A1  Dec. 6, 2018

Related U.S. Application Data

(63) Continuation of application No. 15/526,735, filed as application No. PCT/US2014/071163 on Dec. 18, 2014, now Pat. No. 10,056,456.

(51) Int. Cl.
*H01L 29/66* (2006.01)
*H01L 29/08* (2006.01)
(Continued)

(52) U.S. Cl.
CPC .... *H01L 29/0847* (2013.01); *H01L 29/66462* (2013.01); *H01L 29/7786* (2013.01);
(Continued)

(58) Field of Classification Search
CPC ..................... H01L 29/66462; H01L 29/7786
(Continued)

(56) References Cited

U.S. PATENT DOCUMENTS 4,961,194 A 10/1990 Kuroda et al.
5,367,183 A 11/1994 Perea et al.
(Continued)

FOREIGN PATENT DOCUMENTS

CN 1279733 1/2001
CN 1409868 4/2003
(Continued)

OTHER PUBLICATIONS

International Preliminary Report on Patentability from PCT/US2014/071163 notified Jun. 29, 2017, 3 pgs.
(Continued)

*Primary Examiner* — Tan N Tran
(74) *Attorney, Agent, or Firm* — Green, Howard & Mughal LLP (57) ABSTRACT

The present description relates to n-channel gallium nitride transistors which include a recessed gate electrode, wherein the polarization layer between the gate electrode and the gallium nitride layer is less than about 1 nm. In additional embodiments, the n-channel gallium nitride transistors may have an asymmetric configuration, wherein a gate-to drain length is greater than a gate-to-source length. In further embodiment, the n-channel gallium nitride transistors may be utilized in wireless power/charging devices for improved efficiencies, longer transmission distances, and smaller form factors, when compared with wireless power/charging devices using silicon-based transistors.

25 Claims, 10 Drawing Sheets

(51) Int. Cl.
  *H01L 29/778* (2006.01)
  *H01L 29/423* (2006.01)
  *H01L 29/20* (2006.01)

(52) U.S. Cl.
  CPC ...... *H01L 29/2003* (2013.01); *H01L 29/4236* (2013.01); *H01L 29/42376* (2013.01)

(58) Field of Classification Search
  USPC .................................................. 257/192, 194
  See application file for complete search history.

(56) References Cited

U.S. PATENT DOCUMENTS

| | | | |
|---|---|---|---|
| 6,121,153 | A | 9/2000 | Kikkawa |
| 6,225,196 | B1 | 5/2001 | Yokoyama |
| 6,261,929 | B1 | 7/2001 | Gehrke et al. |
| 6,325,850 | B1 | 12/2001 | Beaumont et al. |
| 6,521,514 | B1 | 2/2003 | Gehrke et al. |
| 6,608,327 | B1 | 8/2003 | Davis et al. |
| 6,617,668 | B1 | 9/2003 | Koide et al. |
| 7,501,669 | B2 | 3/2009 | Parikh et al. |
| 7,952,150 | B1 | 5/2011 | Wohlmuth |
| 8,173,551 | B2 | 5/2012 | Bai et al. |
| 8,313,967 | B1 | 11/2012 | Lee et al. |
| 8,383,471 | B1 | 2/2013 | Shinihara et al. |
| 8,507,304 | B2 | 8/2013 | Kryliouk et al. |
| 8,519,438 | B2 | 8/2013 | Mishra et al. |
| 8,530,978 | B1 | 9/2013 | Chu et al. |
| 8,629,477 | B2 | 1/2014 | Lochtefeld et al. |
| 8,772,786 | B2 | 7/2014 | Tabatabaie et al. |
| 8,836,016 | B2 | 9/2014 | Wu et al. |
| 9,117,777 | B2 | 8/2015 | Vincent et al. |
| 9,153,583 | B2 | 10/2015 | Glass et al. |
| 9,196,709 | B2 | 11/2015 | Lee et al. |
| 9,240,410 | B2 | 1/2016 | Then et al. |
| 10,056,456 | B2 * | 8/2018 | Then ................. H01L 29/66462 |
| 10,229,991 | B2 | 3/2019 | Dasgupta et al. |
| 10,325,774 | B2 | 6/2019 | Dasgupta et al. |
| 2001/0040246 | A1 | 11/2001 | Ishii |
| 2002/0110989 | A1 | 8/2002 | Yamaguchi et al. |
| 2002/0152952 | A1 | 10/2002 | Beaumont |
| 2003/0045017 | A1 | 3/2003 | Hiramatsu et al. |
| 2004/0029365 | A1 | 2/2004 | Linthicum et al. |
| 2004/0169192 | A1 | 9/2004 | Kato et al. |
| 2006/0084245 | A1 | 4/2006 | Khoda |
| 2006/0124962 | A1 | 6/2006 | Ueda et al. |
| 2006/0181828 | A1 | 8/2006 | Sato |
| 2006/0197129 | A1 | 9/2006 | Wohlmuth |
| 2007/0045670 | A1 | 3/2007 | Kuraguchi |
| 2007/0278507 | A1 | 12/2007 | Nakazawa et al. |
| 2008/0036038 | A1 | 2/2008 | Hersee et al. |
| 2008/0070355 | A1 | 3/2008 | Lochtefeld et al. |
| 2008/0093622 | A1 | 4/2008 | Li |
| 2008/0099785 | A1 | 5/2008 | Bai |
| 2008/0197358 | A1 | 8/2008 | Frahm et al. |
| 2009/0039361 | A1 | 2/2009 | Li |
| 2009/0267078 | A1 | 10/2009 | Mishra et al. |
| 2010/0012976 | A1 | 1/2010 | Hydrick et al. |
| 2010/0012977 | A1 | 1/2010 | Derluyn et al. |
| 2010/0068866 | A1 | 3/2010 | Yu et al. |
| 2010/0072576 | A1 | 3/2010 | Arena |
| 2010/0140735 | A1 | 6/2010 | Bommena et al. |
| 2010/0207138 | A1 | 8/2010 | Nakahata et al. |
| 2010/0213511 | A1 | 8/2010 | Lochtefeld |
| 2010/0219452 | A1 | 9/2010 | Brierley |
| 2010/0270559 | A1 | 10/2010 | Ota |
| 2011/0037098 | A1 | 2/2011 | Kim et al. |
| 2011/0079822 | A1 | 4/2011 | Kanamura |
| 2011/0117726 | A1 | 5/2011 | Pinnington et al. |
| 2011/0210377 | A1 | 9/2011 | Haeberlen et al. |
| 2011/0272740 | A1 | 11/2011 | Umeda et al. |
| 2011/0278945 | A1 | 11/2011 | Wheatley, III et al. |
| 2011/0284865 | A1 | 11/2011 | Inoue et al. |
| 2012/0119218 | A1 | 5/2012 | Su et al. |
| 2012/0119220 | A1 | 5/2012 | Guo et al. |
| 2012/0248500 | A1 | 10/2012 | Kajitana |
| 2012/0292789 | A1 | 11/2012 | Sazawa |
| 2012/0305992 | A1 | 12/2012 | Marino et al. |
| 2013/0015460 | A1 | 1/2013 | Chen et al. |
| 2013/0015525 | A1 | 1/2013 | Cheng |
| 2013/0043468 | A1 | 2/2013 | Adekore |
| 2013/0043485 | A1 | 2/2013 | Ueno |
| 2013/0049013 | A1 | 2/2013 | Shimada |
| 2013/0105808 | A1 | 5/2013 | Wong et al. |
| 2013/0105810 | A1 | 5/2013 | Nishimori et al. |
| 2013/0146893 | A1 | 6/2013 | Thei et al. |
| 2013/0221409 | A1 | 8/2013 | Nakajima et al. |
| 2013/0228809 | A1 | 9/2013 | Chang et al. |
| 2013/0256679 | A1 | 10/2013 | Yao et al. |
| 2013/0270579 | A1 | 10/2013 | Yu et al. |
| 2013/0271208 | A1 | 10/2013 | Then et al. |
| 2013/0277686 | A1 | 10/2013 | Liu et al. |
| 2013/0307513 | A1 | 11/2013 | Then et al. |
| 2013/0313561 | A1 | 11/2013 | Suh |
| 2013/0320353 | A1 | 12/2013 | Kryiouk et al. |
| 2013/0334538 | A1 | 12/2013 | Saunier |
| 2014/0014966 | A1 | 1/2014 | Tabatabaie et al. |
| 2014/0042446 | A1 | 2/2014 | Chiang |
| 2014/0084300 | A1 | 3/2014 | Okamoto |
| 2014/0091308 | A1 | 4/2014 | Dasgupta et al. |
| 2014/0091310 | A1 | 4/2014 | Jeon et al. |
| 2014/0091398 | A1 | 4/2014 | Hata et al. |
| 2014/0091845 | A1 | 4/2014 | Then et al. |
| 2014/0094223 | A1 | 4/2014 | Dasgupta et al. |
| 2014/0110759 | A1 | 4/2014 | Murata et al. |
| 2014/0239312 | A1 | 8/2014 | Shatalov et al. |
| 2014/0252368 | A1 | 9/2014 | Lee et al. |
| 2014/0264321 | A1 | 9/2014 | Liang |
| 2014/0264379 | A1 | 9/2014 | Kub et al. |
| 2014/0264380 | A1 | 9/2014 | Kub et al. |
| 2015/0014820 | A1 | 2/2015 | Renaud |
| 2015/0041820 | A1 | 2/2015 | Renaud |
| 2015/0041860 | A1 | 2/2015 | Nishimori et al. |
| 2015/0061075 | A1 | 3/2015 | Yeh |
| 2015/0061078 | A1 | 3/2015 | Abel et al. |
| 2015/0103977 | A1 | 4/2015 | Ono et al. |
| 2015/0115325 | A1 | 4/2015 | Vielemeyer |
| 2015/0144957 | A1 | 5/2015 | Lu et al. |
| 2015/0206796 | A1 | 7/2015 | Dasgupta et al. |
| 2015/0263223 | A1 | 9/2015 | Ito |
| 2015/0318276 | A1 | 11/2015 | Bayram et al. |
| 2015/0340482 | A1 | 11/2015 | Padmanabhan et al. |
| 2016/0111496 | A1 | 4/2016 | Leobandung |
| 2016/0336437 | A1 | 11/2016 | Kajitani et al. |
| 2017/0221999 | A1 | 8/2017 | Dasgupta et al. |
| 2017/0278959 | A1 | 9/2017 | Then et al. |
| 2018/0175184 | A1 | 6/2018 | Then et al. |

FOREIGN PATENT DOCUMENTS

| | | |
|---|---|---|
| CN | 102017160 | 4/2011 |
| CN | 102306658 | 1/2012 |
| CN | 102576663 | 7/2012 |
| EP | 1054442 | 11/2000 |
| JP | S5851575 | 3/1983 |
| JP | 6240778 | 2/1987 |
| JP | 11260835 | 9/1999 |
| JP | 2001230410 | 8/2001 |
| JP | 2002249400 | 9/2002 |
| JP | 200369010 | 3/2003 |
| JP | 2007165431 | 6/2007 |
| JP | 2008004720 | 1/2008 |
| JP | 2008162888 | 7/2008 |
| JP | 2008305816 | 12/2008 |
| JP | 2009054807 | 3/2009 |
| JP | 2011049521 | 3/2011 |
| JP | 2011159795 | 8/2011 |
| JP | 2014078653 | 5/2014 |
| JP | 2014131028 | 7/2014 |
| JP | 2014192167 | 7/2016 |
| KR | 20120048244 | 5/2012 |
| KR | 20130046249 | 5/2013 |
| KR | 101410092 | 6/2014 |
| TW | 201415626 | 4/2014 |

(56) References Cited

FOREIGN PATENT DOCUMENTS

| WO | 2011064997 | 6/2011 |
|----|------------|--------|
| WO | 2015047355 | 4/2015 |
| WO | 2015147816 | 10/2015 |
| WO | 2016043748 | 3/2016 |
| WO | 2016048328 | 3/2016 |
| WO | 2016209263 | 12/2016 |

OTHER PUBLICATIONS

International Search Report and Written Opinion from PCT/US2014/071163 notified Sep. 17, 2015, 13 pgs.
Notice of Allowance from U.S. Appl. No. 15/526,735 notified Apr. 30, 2018, 9 pgs.
Non-Final Office Action from Taiwan Patent Application No. 104137900 notified Feb. 27, 2019, 22 pgs.
Katona, T.M. et al., "Control of crystallographic tilt in GaN grown on Si (111) by cantilever epitaxy", Applied Physics Letters, vol. 81, No. 19, Nov. 4, 2002, 3 pgs.
Masui, Hisashi et al., "Geometrical Characteristics and Surface Polarity of Inclined Crystallographic Plane of the Wurzite and Zincblende Structures", Journal of Electronic Materials, vol. 38, No. 6, 2009.
Wan, J. et al., "Growth of Crack-Free Hexagonal GaN Films on Si (100)", Applied Physics Letters, USA, Jul. 18, 2001, Vo. 79, No. 10. p. 1459-1460, DOI: 10.1063/1.1400770.
Extended European Search Report for European Patent Application No. 14906448.7, dated Jun. 8, 2018.
Extended European Search Report from European Patent Application No. 14905255.7 notified May 16, 2018, 9 pgs.
Extended European Search Report from European Patent Application No. 14908596.1 notified Aug. 13, 2018, 8 pgs.
International Preliminary Report on Patentability from PCT/US2014/063140 notified May 11, 2017, 9 pgs.
International Preliminary Report on Patentability from PCT/US2014/066115 notified Jun. 1, 2017, 9 pgs.
International Search Report and Written Opinion from PCT/US2014/063140 notified Jul. 13, 2015, 12 pgs.
Non-Final Office Action from Japanese Patent Application No. 2017514622 notified Jun. 26, 2018, 5 pgs.
Non-Final Office Action from U.S. Appl. No. 15/511,139 notified Dec. 1, 2017, 11 pgs.
Notice of Allowance from U.S. Appl. No. 15/511,139 notified May 7, 2018, 8 pgs.
Restriction Requirement for U.S. Appl. No. 15/511,139, dated Aug. 29, 2017.
U.S. Non-Final Office Action dated Aug. 30, 2018 for U.S. Appl. No. 15/519,277.
Guo, Jia et al., "MBE-Regrown Ohmics in InAlN HEMTs With a Regrowth Interface Resistance of 0.05$\Omega$ * mm", IEEE Electron Device Letters, vol. 33, No. 4, Apr. 2012, 3 pgs.
Hahn, H et al., "First monolithic integration of GaN-based enhancement mode n-channel and p-channel heterostructure field effect transistors", 72nd Device Research Conference, Jun. 2014 (Jun. 2014), pp. 59-260, XP055155997, DOI: 10.1109/DRC.2014.6872396 ISBN: 978-1-47-995405-6.
Takei, Y et al., "Ohmic Contact Properties Depending on AlGaN Layer Thickness for AlGaN/GaN High Electron Mobility Transistor Structures", ECS Transactions, vol. 61, No. 4, Mar. 20, 2014 (Mar. 20, 2014), pp. 265-270, XP055480356, US ISSN: 1938-6737, DOI: 10.1149/06104.0265ecst.
Office Action from Chinese Patent Application No. 201480083467.5 notified Jan. 15, 2020, 23 pgs.
Notice of Allowance from Taiwan Patent Application No. 104137900 notified Aug. 29, 2019, 2 pgs.
Office Action from European Patent Application No. 14908596.1 notified Sep. 4, 2019, 6 pgs.

* cited by examiner

N-CHANNEL GALLIUM NITRIDE TRANSISTORS

CLAIM OF PRIORITY

This Application is a Continuation of, and claims priority to, U.S. patent application Ser. No. 15/526,735, filed on May 12, 2017 and titled "N-CHANNEL GALLIUM NITRIDE TRANSISTORS", which is a National Stage Entry of, and claims priority to, International Application No. PCT/US2014/071163, filed Dec. 18, 2014 and titled "N-CHANNEL GALLIUM NITRIDE TRANSISTORS", which is incorporated by reference in its entirety for all purposes.

TECHNICAL FIELD

Embodiments of the present description generally relate to the field of microelectronic devices, and, more particularly, to forming n-channel gallium nitride transistors and the use thereof in wireless power/charging devices.

BACKGROUND

The microelectronics industry is continually striving to produce ever faster and smaller microelectronic packages for use in various electronic products, including, but not limited to, computer server products and portable products, such as laptop/netbook computers, electronic tablets, smart phones, digital cameras, and the like. One route to achieve these goals is the fabrication of System-on-Chip (SoC) devices, wherein all of the components of an electronic system are fabricated on a single chip. In such SoC devices, power management integrated circuits (PMIC) and radio frequency integrated circuits (RFIC) are critical functional blocks, and are as important as logic and memory integrated circuits in determining the power efficiency and the form factor of such SoC devices. Moreover, there is a growing need to power and/or charge mobile devices wirelessly. Solutions for wireless power/charging devices employing silicon power Metal-on-Semiconductor Field Effect Transistors (MOSFET) have emerged in the marketplace. However, these silicon power MOSFETs require considerable power and dissipates substantial power, due to their high on-state resistance and large capacitance, which could otherwise be usefully transmitted wirelessly to power and/or charge mobile devices. Therefore, there is an ongoing effort to scaled down and/or improve the efficiency of such wireless power/charging devices.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description relate to n-channel gallium nitride transistors which include a recessed gate electrode wherein the polarization layer between the gate electrode and the gallium nitride layer is less than about 1 nm. In additional embodiments, the n-channel gallium nitride transistors may have an asymmetric configuration, wherein a gate-to drain length is greater than a gate-to-source length. In further embodiment, the n-channel gallium nitride transistors may be utilized in wireless power/charging devices for improved efficiencies, longer transmission distances, and smaller form factors when compared with wireless power/charging devices using silicon-based transistors.

Figure 1:
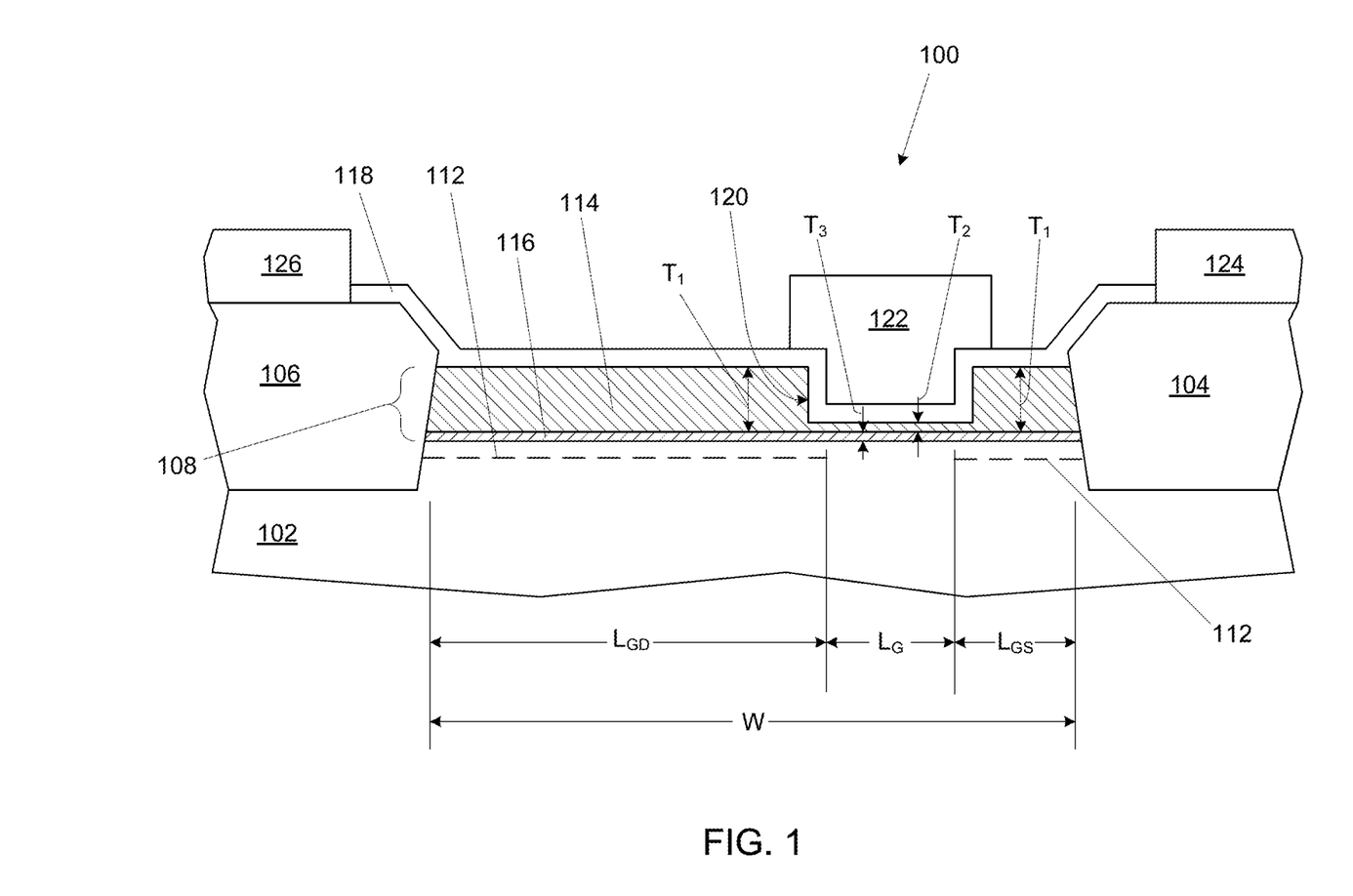
FIG. 1 is a side cross-section view of a gallium nitride transistor, according to an embodiment of the present description.

FIG. 1 illustrates an n-channel gallium nitride transistor 100 according to embodiments of the present description.

The n-channel gallium nitride transistor 100 may comprise a gallium nitride layer 102 having a source structure 104 and an opposing drain structure 106 formed therein. A charge inducing layer 108 may be formed on the gallium nitride layer 102 extending between the source structure 104 and the drain structure 106 (transistor width W), which forms a 2D electron gas (illustrated with dashed line 112) within the gallium nitride layer 102. In one embodiment, the charge inducing layer 108 may comprise a polarization layer 114 formed on a crystal transition layer 116, wherein the crystal transition layer 116 abuts the gallium nitride layer 102. The polarization layer 114 may have ternary crystal structure which forms the 2D electron gas 112, but may inhibit electron mobility within the binary crystal structure of the gallium nitride layer 102. Therefore, the crystal transition layer 116 may be a binary crystal structure which acts as a transition between the polarization layer 114 and the gallium nitride layer 102. It is understood that although the charge inducing layer 108 is illustrated as having two layers (i.e. the polarization layer 114 and the crystal transition layer 116), it may be fabricated as a single layer (i.e. the polarization layer 114 only) or have more than two layers.

In one embodiment, the n-channel gallium nitride transistor 100 is an enhancement mode transistor. Thus, as illustrated in FIG. 1, a portion of the polarization layer 114 may be removed proximate forming a recess 120 in a desired location for a gate electrode 122 to disrupt the 2D electron gas 112, such that it does not extend through a gate length $L_g$ of the n-channel gallium nitride transistor 100 to achieve enhancement mode operation.

As shown, a gate dielectric layer 118 may be formed over the polarization layer 114 and the gate electrode 122 may be formed on the gate dielectric layer 118, such that the gate dielectric layer 118 electrically isolates the gate electrode 122 from the polarization layer 114. Furthermore, source contacts 124 and drain contacts 126 may formed on the source structure 104 and the drain structure 106, respectively, and may be utilized to form electrical connections with external components (not shown) through the formation of interconnection structure (not shown), as will be understood to those skilled in the art.

As further illustrated in FIG. 1, the n-channel gallium nitride transistor 100 may include a gate-to-drain length $L_{GD}$ (i.e. from the gate to the drain structure 106) and a gate-to-source length $L_{GS}$ (i.e. from the gate to the source structure 104). In one embodiment, the gate-to-drain length $L_{GD}$ may range from about 120 nm to about 400 nm. In other embodiment, the gate-to-source length $L_{GS}$ may range from about 5 nm to about 400 nm. In still another embodiment, the gate length $L_G$ may range from about 20 nm to about 500 nm. In one embodiment, the n-channel gallium nitride transistor 100 may have an asymmetric structure with a gate-to-drain length $L_{GD}$ (i.e. from the gate to the drain structure 106) larger than a gate-to-source length $L_{GS}$ (i.e. from the gate to the source structure 104), which will minimize resistance between across the gate-to-source length $L_{GS}$, as will be understood to those skilled in the art.

The polarization layer 114 may include, but is not limited to aluminum gallium nitride, aluminum indium nitride, and indium gallium nitride. In one embodiment, the polarization layer 114 is $Al_{0.83}In_{0.17}N$. In one embodiment, the polarization layer 114 may be have a thickness $T_1$ of between about 5 nm and 10 nm over the gate-to-drain length $L_{GD}$ area and over the gate-to-source length $L_{GS}$ area, which may achieve low on-state resistance. In a further embodiment, the polarization layer 114 may have a thickness $T_2$ of less than about 1 nm over the gate length $L_G$ area, which may achieve enhancement mode operation. In another embodiment, the crystal transition layer 116 may include, but is not limited to, indium nitride and aluminum nitride, and may have a thickness $T_3$ of less than about 1 nm.

The gate dielectric layer 118 may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, tantalum silicon oxide, titanium oxide, barium strontium titanium oxide, barium titanium oxide, strontium titanium oxide, yttrium oxide, aluminum oxide, lead scandium tantalum oxide, and lead zinc niobate. It is noted that a high-K gate dielectric layer 118 may be advantageous to achieve low gate leakages. The gate dielectric layer 118 can be formed by well-known techniques, such as chemical vapor deposition ("CVD"), physical vapor deposition ("PVD"), atomic layer deposition ("ALD").

The gate electrode 122 can be formed of any suitable gate electrode material. In an embodiment of the present disclosure, the gate electrode 122 may be formed from materials that include, but are not limited to, polysilicon, tungsten, ruthenium, palladium, platinum, cobalt, nickel, hafnium, zirconium, titanium, tantalum, aluminum, titanium carbide, zirconium carbide, tantalum carbide, hafnium carbide, aluminum carbide, other metal carbides, metal nitrides, and metal oxides. The gate electrode 122 can be formed by well-known techniques, such as by blanket depositing a gate electrode material and then patterning the gate electrode material with well-known photolithography and etching techniques, as will be understood to those skilled in the art.

Gallium nitride has a relatively wide bandgap (e.g. about 3.4 eV), when compared to the bandgap of silicon (about 1.1 eV). Therefore, the n-channel gallium nitride transistor 100 may withstand large electric fields, such as applied voltages, drain voltage, and the like, before suffering breakdown, when compared to a silicon based transistor of similar dimensions. This also enables n-channel gallium nitride transistors 100 to be scaled to even smaller physical dimensions while operating at the same supply voltage; thus, enabling small on-state resistance and smaller capacitance, which may result in reduced power dissipation and hence higher circuit efficiencies. Furthermore, as will be understood to those skilled in the art, the n-channel gallium nitride transistor 100 employs the 2D electron gas 112 as its electron transport channel for the operation thereof. The 2D electron gas 112 is formed at the abrupt hetero-interface formed by the deposition of the charge inducing layer 108 on the gallium nitride layer 102 through spontaneous and piezoelectric polarization, as will be understood to those skilled in the art. Very high charge densities up to about 2E13 per $cm^2$ can be formed by such a mechanism, without the use of impurity dopants, which allows for high electron mobility, e.g. greater than about 1000 $cm^2/V_s$ (low sheet resistance at $L_{GD}$ and $L_{GS}$ regions). As will be understood to those skilled in the art, the n-channel gallium nitride transistor 100 may enable low parasitic leakages due to absence of band-to-band tunneling, low gate induced drain leakage (GIDL), and low generation of electron-hole pairs from impact ionization from hot electrons.

Figure 2:
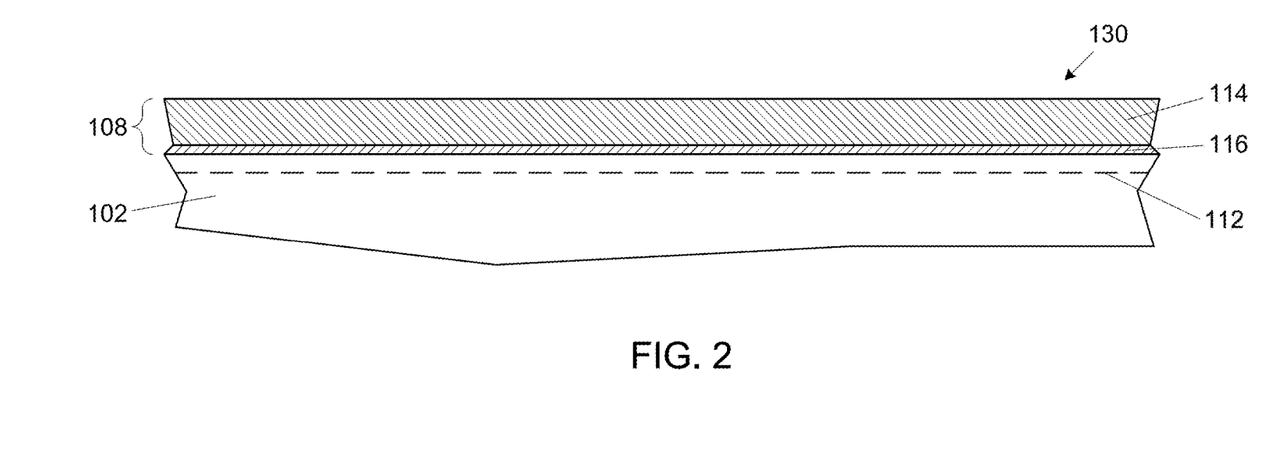
FIGS. 2-13 are side cross-section views of the fabrication of an asymmetrical n-channel gallium nitride transistor, according to an embodiment of the present description.

FIGS. 2-13 illustrate a process for forming a mirror image pair of n-channel gallium nitride transistors, according to one embodiment of the present description. As shown in FIG. 2, a stacked substrate 130 may be formed comprising the charge inducing layer 108 formed on the gallium nitride layer 102. As discussed with regard to FIG. 1, in one embodiment, the charge inducing layer 108 may comprise the polarization layer 114 formed on the crystal transition layer 116, wherein the crystal transition layer 116 abuts the gallium nitride layer 102.

Figure 3:
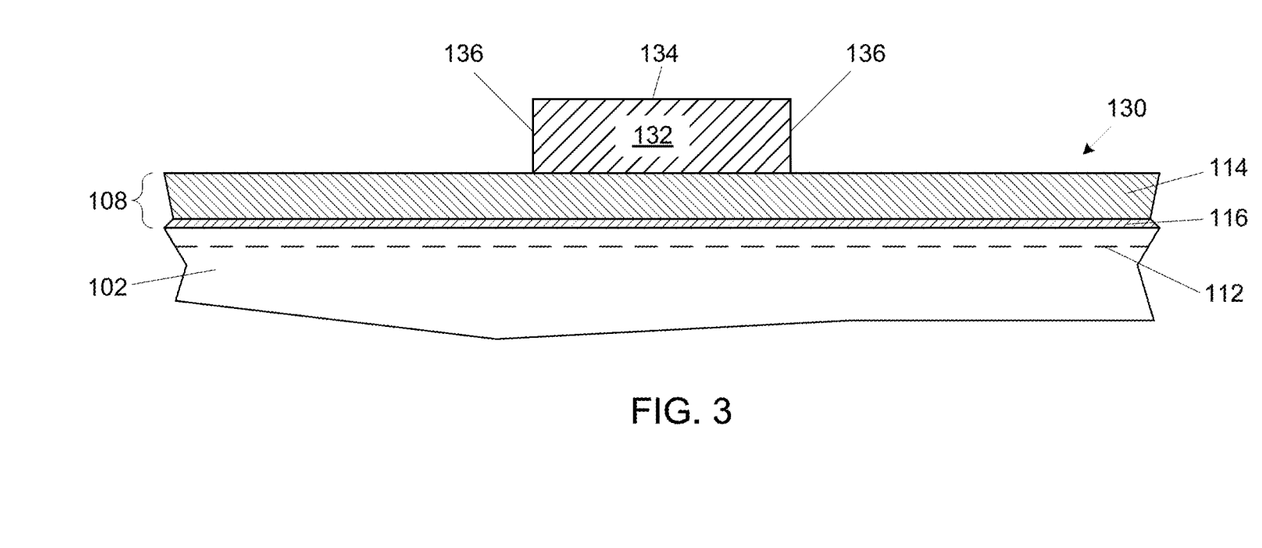

As shown in FIG. 3, a hardmask 132, such as silicon nitride, silicon oxide, and the like, may be patterned by any known technique, such as photolithography, on the polarization layer 114. The hardmask 132 may define a region for a shared drain for the mirror image pair of n-channel gallium nitride transistors to be formed.

Figure 4:
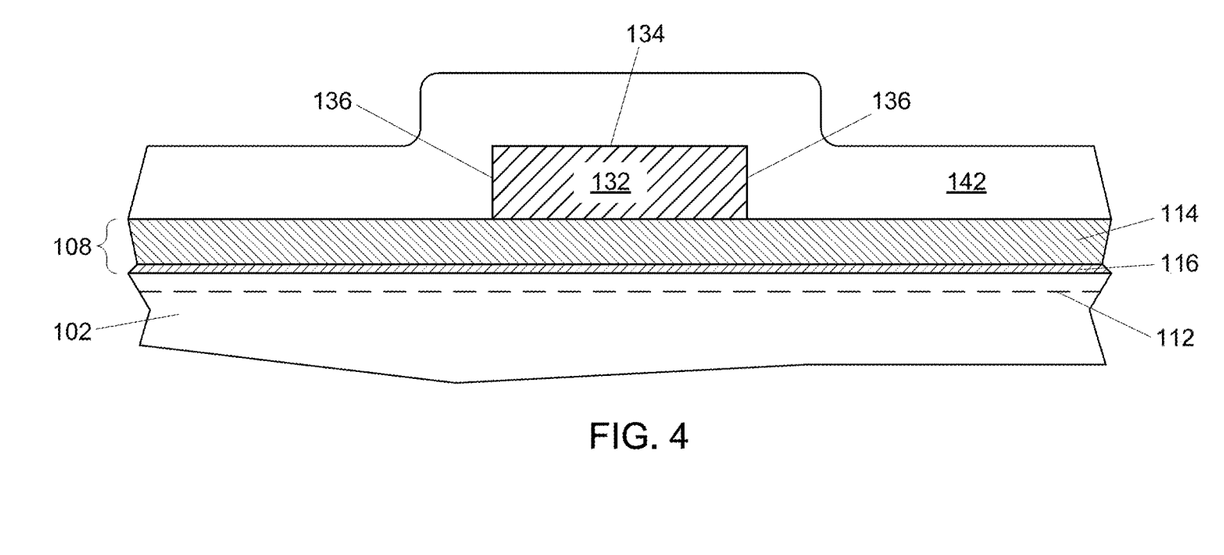
Figure 5:
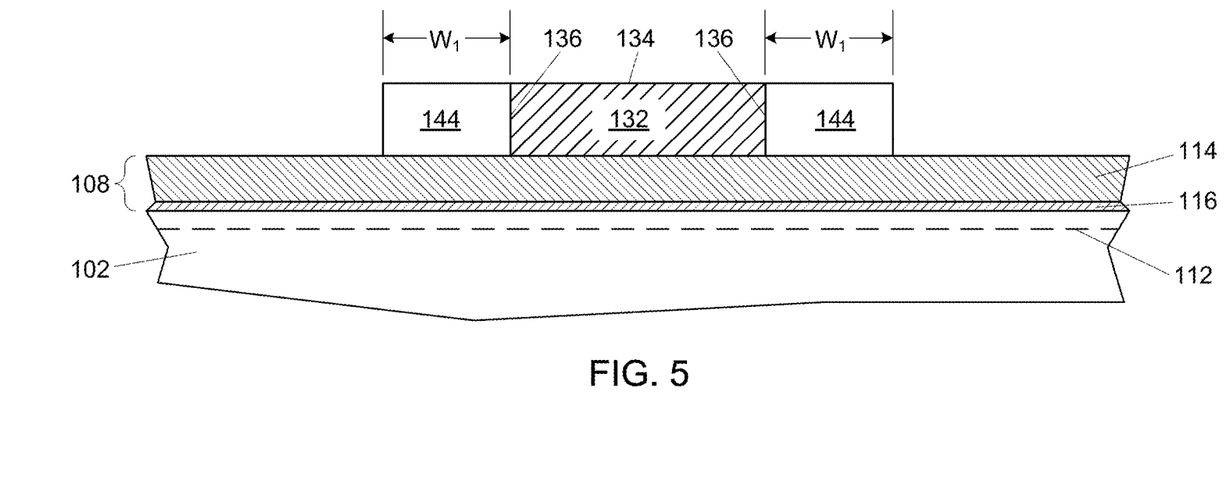

As shown in FIG. 4, a first spacer material 142 may be deposited over the hardmask 132 and the gallium nitride layer 102, as shown in FIG. 5, the first spacer material 142 (see FIG. 4) may be etched to expose a top surface 134 of the hardmask 132 and expose portions of the polarization layer 114, whereby first spacers 144 are formed on opposing sides 136 of the hardmask 132. A width $W_1$ of the first spacers 144 may define the gate-to-drain length $L_{GD}$ (see FIG. 1) for each one of the pair of n-channel gallium nitride transistors to be formed.

Figure 6:
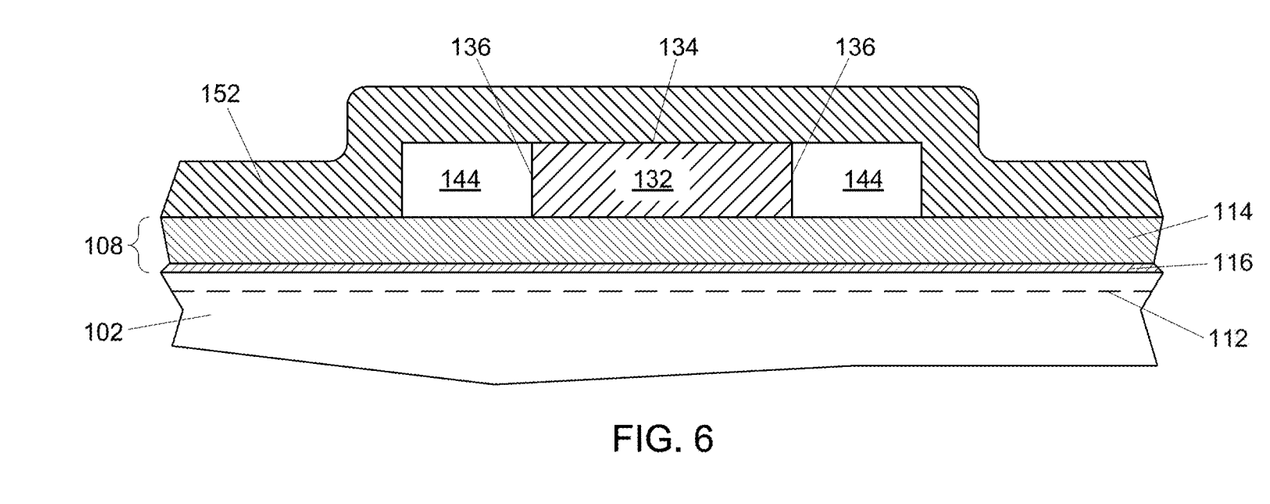
Figure 7:
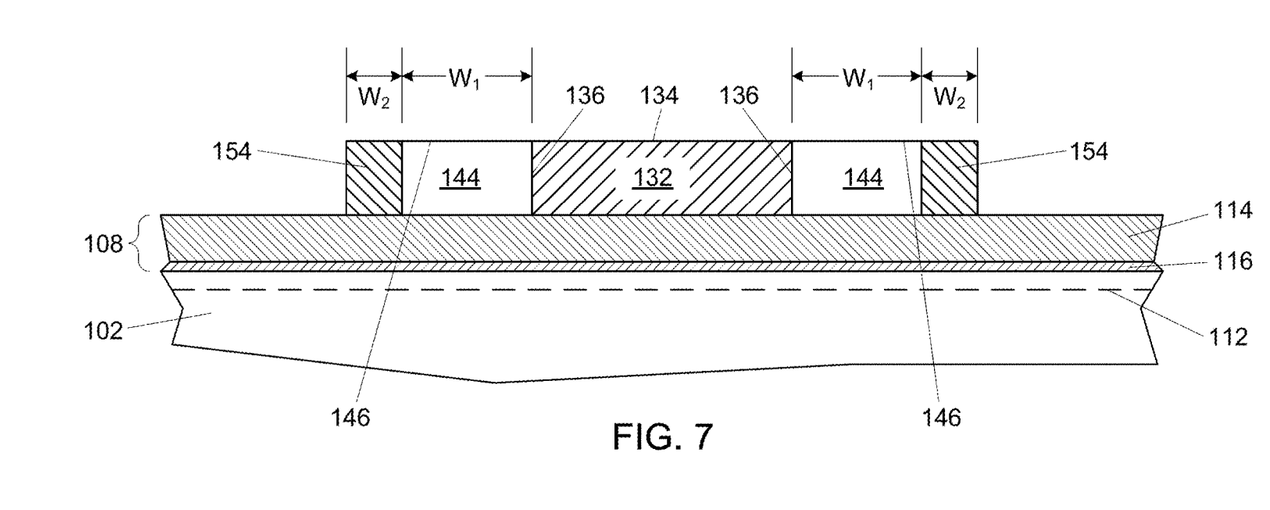

As shown in FIG. 6, a second spacer material 152 may be deposited over the hardmask top surface 134, the first spacers 144, and the polarization layer 114. As shown in FIG. 7, the second spacer material 152 (see FIG. 6) may be etched to expose the hardmask top surface 134, a top surface 146 of the first spacers 144, and expose portions of the polarization layer 114, whereby second spacers 154 are formed on opposing hardmask sides 136 abutting the first spacers 144. A width $W_2$ of the second spacers 154 may define the channel or gate length $L_G$ (see FIG. 1) for each one of the pair of n-channel gallium nitride transistors.

Figure 8:
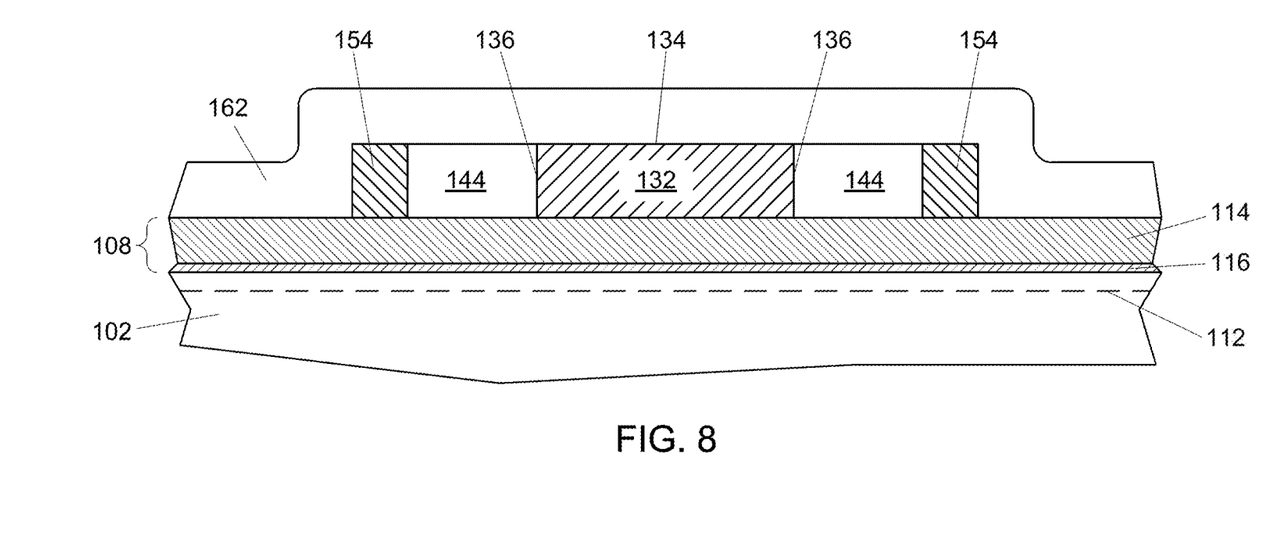
Figure 9:
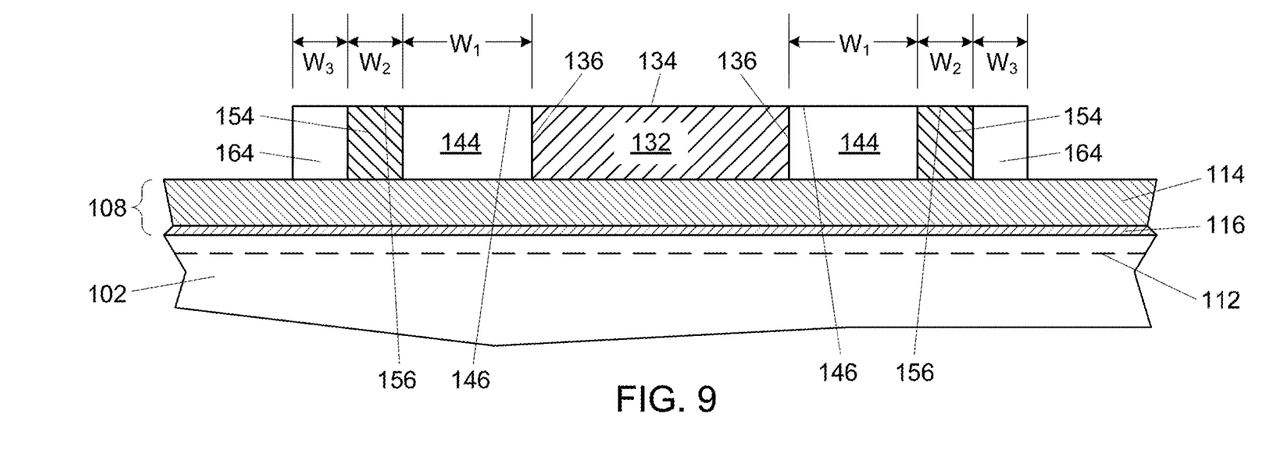

As shown in FIG. 8, a third spacer material 162 may be deposited over the hardmask top surface 134, the first spacers 144, the second spacers 154, and the polarization layer 114. As shown in FIG. 9, the third spacer material 162 (see FIG. 8) may be etched to expose the hardmask top surface 134, the first spacer top surfaces 146, a top surface 156 of the second spacers 154, and portions of the polarization layer 114, whereby third spacers 164 are formed on opposing hardmask sides 136 abutting the second spacers 154. A width W3 of the third spacers 164 may define the gate-to-source length $L_{GS}$ (see FIG. 1) for each one of the pair of n-channel gallium nitride transistors to be formed.

Figure 10:
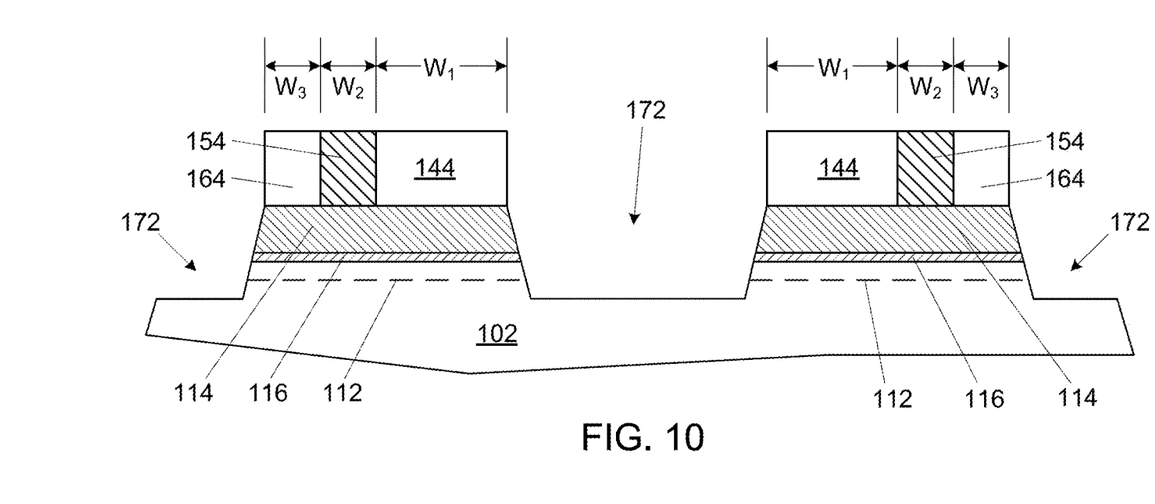

As shown in FIG. 10, the hardmask 132 (see FIG. 9) may be removed and, using the first spacers 144, the second spacers 154, and the third spacers 164 as etch masks, recesses 172 may be formed to extend through the charge inducing layer 108 (e.g. the polarization layer 114 and the crystal transition layer 116) and into the gallium nitride layer 102, by any known technique, such as etching. In one embodiment, the recesses 172 may be formed with a plasma etch in a chlorine based chemistry.

Figure 11:
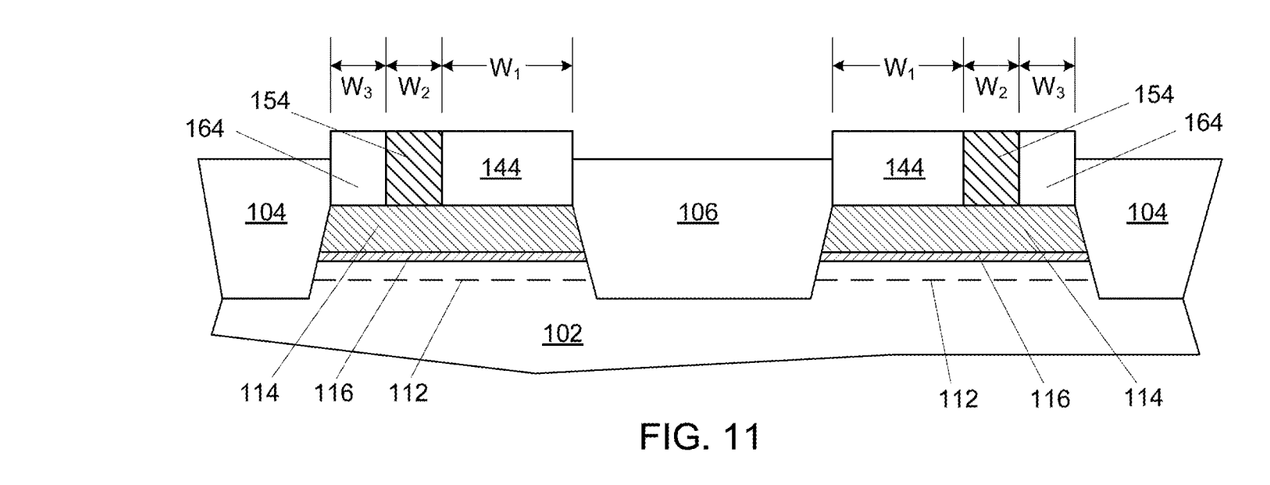

As shown in FIG. 11, the source structures 104 and the shared drain structure 106, such as N+ indium gallium nitride, N+ gallium nitride, N+ indium nitride, and any graded combination thereof, may be formed by epitaxial regrowth from the gallium nitride layer 102. In one embodiment, the regrowth process may comprise epitaxial crystal growth techniques, such as metal organic chemical vapor deposition (MOCVD) or molecular beam epitaxy (MBE).

Figure 12:
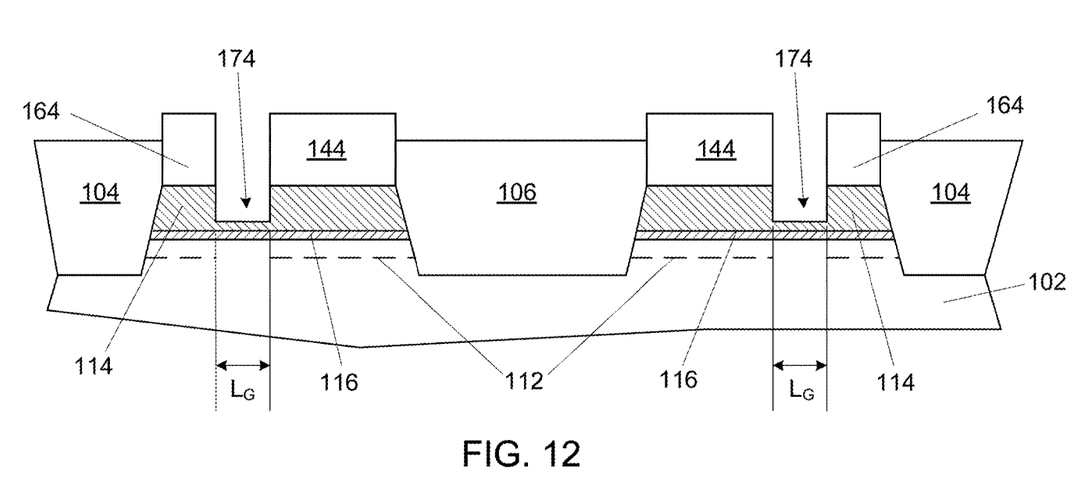

As shown in FIG. 12, the second spacers 154 may be removed, as well as a portion of the polarization layer 114 to form gate recesses 174 in the polarization layer 114, which, as previously discussed, disrupts the 2D electron gas 112, such that it does not extend through a gate length $L_g$ (previously labeled width $W_2$) to achieve enhancement mode operation.

Figure 13:
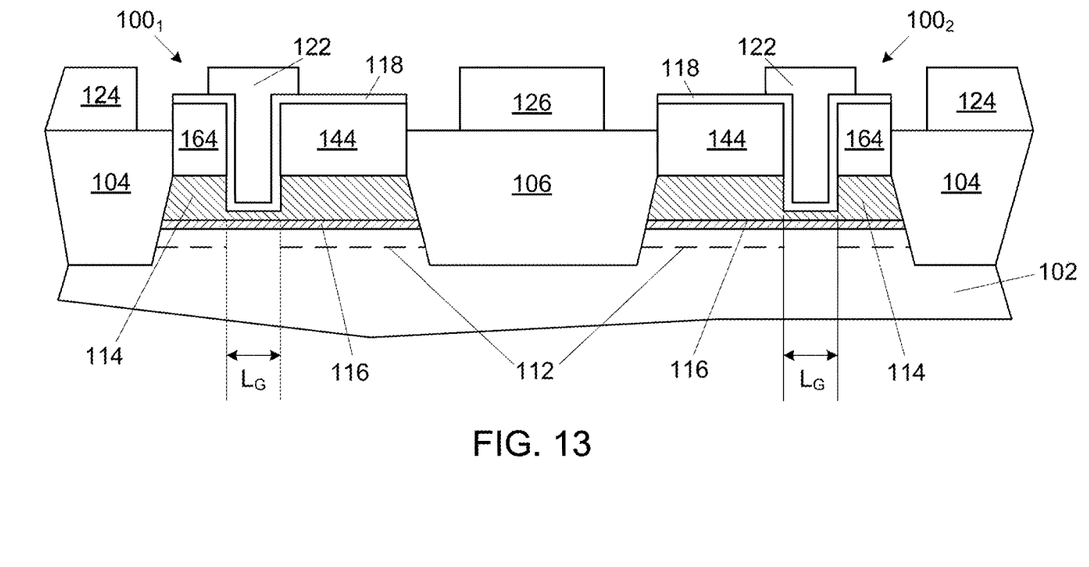

As shown in FIG. 13, the gate dielectric layer 118 may be formed on the polarization layer 114 within the recesses 174 (see FIG. 12) and the gate electrodes 122 may be formed on the gate dielectric layer 118 such that the gate dielectric layer 118 electrically isolates the gate electrode 122 from the polarization layer 114 to from the n-channel gallium nitride transistors $100_1$ and $100_2$. Furthermore, source contacts 124 and drain contacts 126 may be formed on the source structures 104 and the drain structure 106, respectively. As will be understood to those, skilled in the art an interconnection structure (not shown) would be formed over the n-channel gallium nitride transistors $100_1$ and $100_2$ to appropriately connect the gate electrodes 122, the source contacts 124, and the drain contacts 126 with external components (not shown). However, for the sake of brevity and conciseness, the interconnection structure is not shown.

Figure 14:
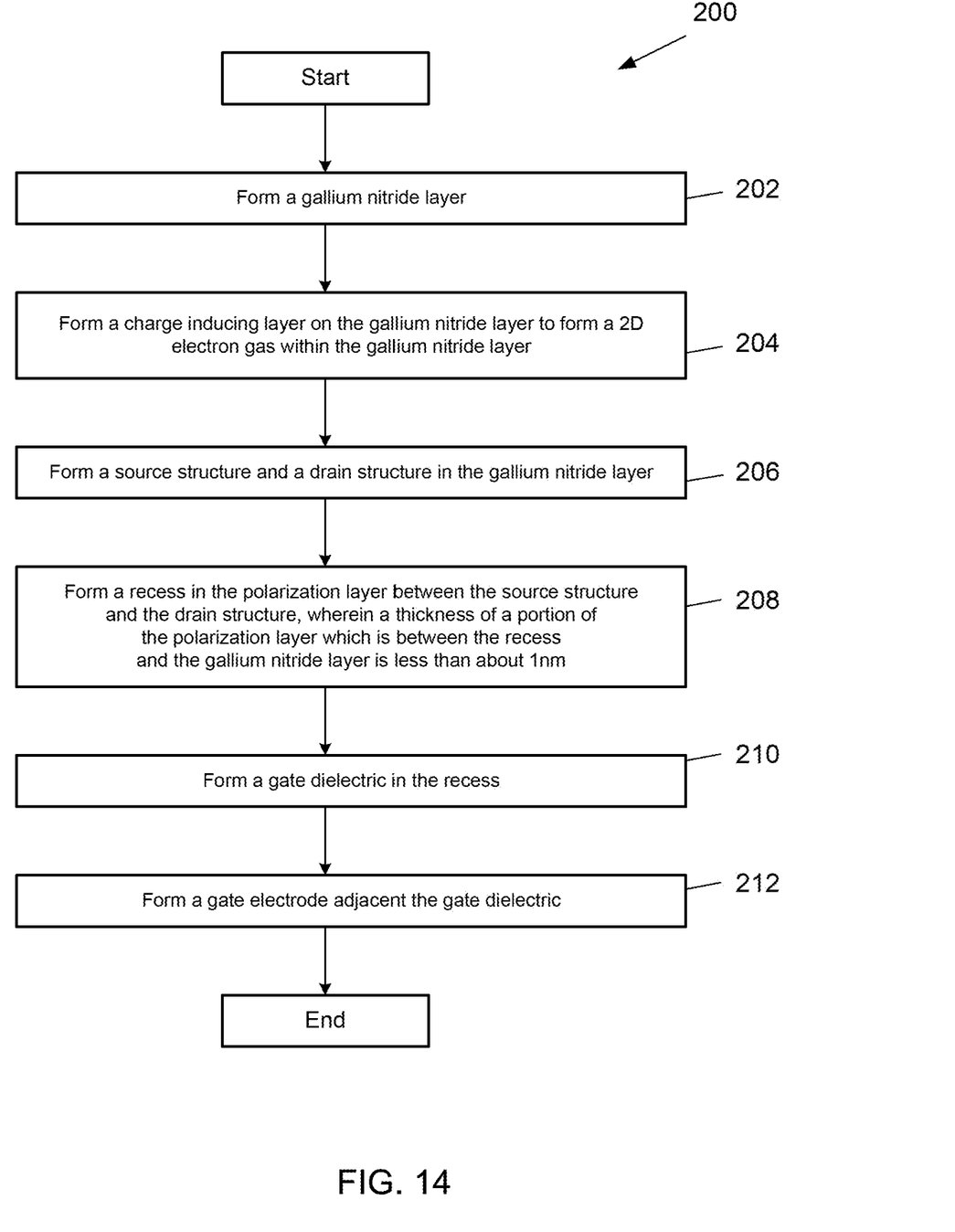
FIG. 14 is a flow chart of a process of fabricating an asymmetrical n-channel gallium nitride transistor, according to an embodiment of the present description.

FIG. 14 is a flow chart of a process 200 of fabricating an n-channel gallium nitride transistor according to an embodiment of the present description. As set forth in block 202, a gallium nitride layer may be formed. A charge inducing layer may be formed on the gallium nitride layer to form a 2D electron gas within the gallium nitride layer, as set forth in block 204. As set forth in block 206, a source structure and a drain structure may be formed in the gallium nitride layer. A recess may be formed within the polarization layer between the source structure and the drain structure, wherein a thickness of a portion of the polarization layer which is between the recess and the gallium nitride layer is less than about 1 nm, as set in block 208. As set forth in block 210, a gate dielectric may be formed in the recess. A gate electrode may be formed adjacent the gate dielectric, as set forth in block 212.

Figure 15:
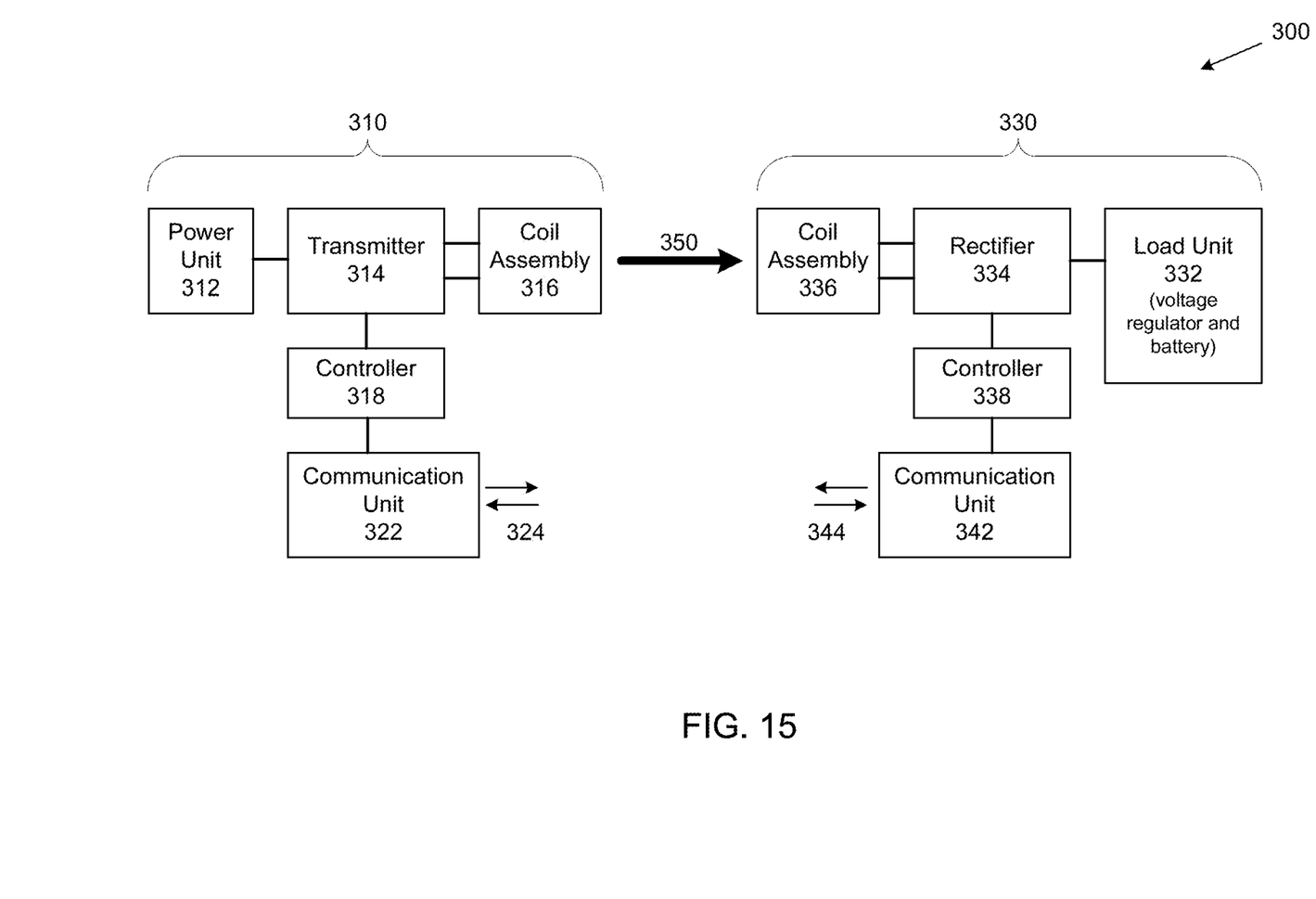
FIGS. 15 and 16 are schematics of a wireless power/charging device, according to an embodiment of the present description.

FIG. 15 illustrates a wireless power/charging device 300, according to an embodiment of the present description. The wireless power/charging device 300 may include a transmission module 310 and a receiving module 330. The transmission module 310 may comprise a power unit 312 (such as an AC to DC converter), a transmitter 314, a coil assembly 316, a controller 318, and a communication unit 322 (such as for radio frequency communication illustrated by arrows 324). The receiving module 330, such as components within a mobile device or a device which plugs into a mobile device, may comprise a load unit 332 which includes a voltage regulator and a battery, a rectifier 334, a coil assembly 336, a controller 338, and a communication unit 342 (such as for radio frequency communication illustrated by arrows 344). The specific interconnections and component operations of such a wireless power/charge device 300 are well known in the art and for the sake of brevity and conciseness will not be discussed herein. In embodiments for the present description, high voltage n-channel gallium nitride transistors 100 (see FIG. 1) may be utilized in place of silicon power MOSFETs, as n-channel gallium nitride transistors have on-state resistances that are about three times better at the given breakdown voltage of 40V.

Figure 16:
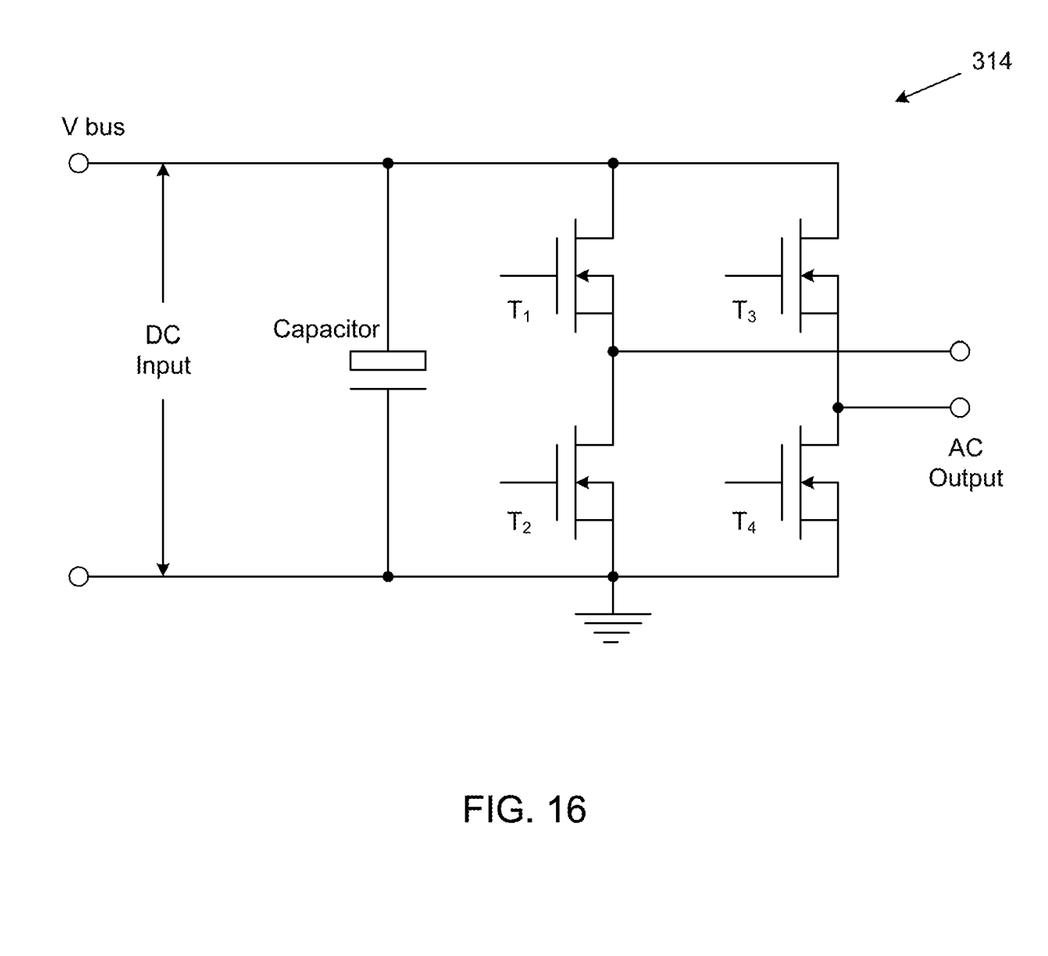

In one embodiment of the present description, the n-channel gallium transistor 100 (see FIG. 1) may be utilized in the transmitter 314 of the transmission module 310. As shown in FIG. 16, the transmitter 314 (i.e. full-bridge inverter) may have four n-channel gallium nitride transistors $T_1$, $T_2$, $T_3$, and $T_4$. Such a configuration, the n-channel gallium nitride transistors $T_1$, $T_2$, $T_3$, and $T_4$ may enable at least a 10% higher DC-to-AC conversion efficiency than silicon transistors. Furthermore, the use of the n-channel gallium nitride transistors $T_1$, $T_2$, $T_3$, and $T_4$ may enable wireless power transmission over the air at 10 MHz or higher, which is over 100 times higher frequency than with comparable silicon transistors, and enabling distance transmission up to 2 meters (illustrated with an arrow 350), which is over 25 times longer than with comparable silicon transistors. Moreover, with the higher wireless power transmission frequencies, the form factor of the transmission module coil assembly 316 and the receiving module coil assembly 336 may be as much as ten times thinner.

In a further embodiment, utilizing the n-channel gallium nitride transistors 100 (see FIG. 1) in the voltage regulator of the receiving module load unit 332 may result in as much as a 100 times smaller form factor for the receiving module 330 and up to 7% higher efficiency than voltage regulators having silicon transistors. It is anticipated that an overall wireless power transmit efficiency improvement of 14% through the utilization n-channel gallium nitride transistors 100 (see FIG. 1) of the present description in the transmission module 310 and the receiving module 330. The circuit design of a voltage regulator is well known in the art, and thus, for the sake of brevity and conciseness, is not illustrated with specificity.

It is understood that the subject matter of the present description is not necessarily limited to specific applications illustrated in FIGS. 1-16. The subject matter may be applied to other microelectronic device and assembly applications, as well as any other appropriate transistor applications, as will be understood to those skilled in the art.

The following examples pertain to further embodiments, wherein Example 1 is an n-channel gallium nitride transistor, comprising a gallium nitride layer; a source structure and a drain structure formed in the gallium nitride layer; a charge inducing layer comprising a polarization layer extending between the structure and the drain structure; a 2D electron gas within the gallium nitride layer; and a gate electrode extending at least partially into the polarization layer, wherein a thickness of a portion of the polarization layer which is between the gate electrode and the gallium nitride layer is less than about 1 nm.

In Example 2, the subject matter of Example 1 can optionally include a gate dielectric disposed between the gate electrode and the polarization layer.

In Example 3, the subject matter of either of Examples 1 or 2 can optionally include a portion of the polarization layer which is not between the gate electrode and the gallium nitride layer being between about 5 nm and 10 nm.

In Example 4, the subject matter of any of Examples 1 to 3 can optionally include the polarization layer being selected from the group consisting of aluminum gallium nitride, aluminum indium nitride, and indium gallium nitride.

In Example 5, the subject matter of any of Examples 1 to 4 can optionally include a crystal transition layer disposed between the gallium nitride layer and the polarization layer.

In Example 6, the subject matter of Example 5 can optionally include the crystal transition layer being selected from the group consisting of indium nitride and aluminum nitride.

In Example 7, the subject matter of any of Examples 1 to 6 can optionally include a gate-to-drain length between about 120 nm to about 400 nm and a gate-to-source length between about 5 nm to about 400 nm.

In Example 8, the subject matter of Example 7 can optionally include the gate-to drain length being greater than the gate-to-source length.

The following examples pertain to further embodiments, wherein Example 9 is a method of forming an n-channel gallium nitride transistor, comprising forming a gallium nitride layer; forming a charge inducing layer comprising a polarization layer on the gallium nitride layer to form a 2D electron gas within the gallium nitride layer; forming a source structure and a drain structure formed in the gallium nitride layer; forming a recess within the polarization layer between the source structure and the drain structure, wherein a thickness of a portion of the polarization layer which is between the recess and the gallium nitride layer is less than about 1 nm; forming asymmetrical dielectric spacers of different widths; forming a gate dielectric within the recess; and forming a gate electrode adjacent the gate dielectric.

In Example 10, the subject matter of Example 9 can optionally include forming the charge inducing layer comprising the polarization layer on the gallium nitride layer comprises forming the charge inducing layer comprising the polarization layer having a thickness of between about 5 nm and 10 nm.

In Example 11, the subject matter of either of Examples 9 or 10 can optionally include forming the polarization layer selected from the group consisting of aluminum gallium nitride, aluminum indium nitride, and indium gallium nitride.

In Example 12, the subject matter of any of Examples 9 to 11 can optionally include forming a crystal transition layer between the gallium nitride layer and the polarization layer.

In Example 13, the subject matter of Example 12 can optionally include forming the crystal transition layer from a material selected from the group consisting of indium nitride and aluminum nitride.

In Example 14, the subject matter of any of Examples 9 to 13 can optionally include forming a gate-to-drain length between about 120 nm to about 400 nm and forming a gate-to-source length between about 5 nm to about 400 nm.

In Example 15, the subject matter of Example 14 can optionally include the gate-to-drain length being greater than the gate-to-source length.

The following examples pertain to further embodiments, wherein Example 16 is a wireless power/charging device transmission module, comprising a coil assembly; and a transmitter, wherein the transmitter includes at least one n-channel gallium nitride transistor, comprising: a gallium nitride layer; a source structure and a drain structure formed in the gallium nitride layer; a charge inducing layer comprising a polarization layer extending between the structure and the drain structure; a 2D electron gas within the gallium nitride layer; and a gate electrode extending at least partially into the polarization layer.

In Example 17, the subject matter of Example 16 can optionally include a thickness of a portion of the polarization layer which is between the gate electrode and the gallium nitride layer being less than about 1 nm.

In Example 18, the subject matter of either of Example 16 or 17 can optionally include a gate dielectric disposed between the gate electrode and the polarization layer.

In Example 19, the subject matter of any of Examples 16 to 18 can optionally include a portion of the polarization layer which is between the gate electrode and the gallium nitride layer being between about 5 nm and 10 nm.

In Example 20, the subject matter of any of Example 16 to 19 can optionally include a crystal transition layer disposed between the gallium nitride layer and the polarization layer.

The following examples pertain to further embodiments, wherein Example 21 is a wireless power/charging device receiving module, comprising a coil assembly; a rectifier; and a load unit including a voltage regulator and a battery, wherein the voltage regulator includes at least one n-channel gallium nitride transistor, comprising: a gallium nitride layer; a source structure and a drain structure formed in the gallium nitride layer; a charge inducing layer comprising a polarization layer extending between the structure and the drain structure; a 2D electron gas within the gallium nitride layer; and a gate electrode extending at least partially into the polarization layer.

In Example 22, the subject matter of Example 21 can optionally include a thickness of a portion of the polarization layer which is between the gate electrode and the gallium nitride layer being less than about 1 nm.

In Example 23, the subject matter of either of Example 21 or 22 can optionally include a gate dielectric disposed between the gate electrode and the polarization layer.

In Example 24, the subject matter of any of Examples 21 to 23 can optionally include a portion of the polarization layer which is between the gate electrode and the gallium nitride layer being between about 5 nm and 10 nm.

In Example 25, the subject matter of any of Example 21 to 24 can optionally include a crystal transition layer disposed between the gallium nitride layer and the polarization layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. An n-channel gallium nitride transistor, comprising:
   a gallium nitride layer;
   a source structure and a drain structure formed in the gallium nitride layer;
   a charge inducing layer comprising a polarization layer extending between the source structure and the drain structure; and
   a gate electrode extending at least partially into the polarization layer, wherein a thickness of a portion of the polarization layer which is between the gate electrode and the gallium nitride layer is less than about 1 nm.

2. The n-channel gallium nitride transistor of claim 1, further comprising a gate dielectric disposed between the gate electrode and the polarization layer.

3. The n-channel gallium nitride transistor of claim 1, further comprising a portion of the polarization layer which is not between the gate electrode and the gallium nitride layer is between about 5 nm and 10 nm.

4. The n-channel gallium nitride transistor of claim 1, wherein the polarization layer is selected from the group consisting of aluminum gallium nitride, aluminum indium nitride, and indium gallium nitride.

5. The n-channel gallium nitride transistor of claim 1, further including a crystal transition layer disposed between the gallium nitride layer and the polarization layer.

6. The n-channel gallium nitride transistor of claim 5, wherein the crystal transition layer is selected from the group consisting of indium nitride and aluminum nitride.

7. The n-channel gallium nitride transistor of claim 1, further including a gate-to-drain length between about 120 nm to about 400 nm and a gate-to-source length between about 5 nm to about 400 nm.

8. The n-channel gallium nitride transistor of claim 7, wherein the gate-to drain length is greater than the gate-to-source length.

9. A method of forming an n-channel gallium nitride transistor, comprising:
   forming a gallium nitride layer;
   forming a charge inducing layer comprising a polarization layer on the gallium nitride layer;
   forming a source structure and a drain structure formed in the gallium nitride layer;
   forming a recess within the polarization layer between the source structure and the drain structure, wherein a thickness of a portion of the polarization layer which is between the recess and the gallium nitride layer is less than about 1 nm;
   forming asymmetrical dielectric spacers of different widths;
   forming a gate dielectric within the recess; and
   forming a gate electrode adjacent the gate dielectric.

10. The method of claim 9, wherein forming the charge inducing layer comprising the polarization layer on the gallium nitride layer comprises forming the charge inducing layer comprising the polarization layer having a thickness of between about 5 nm and 10 nm.

11. The method of claim 9, wherein forming the charge inducing layer comprises forming the polarization layer selected from the group consisting of aluminum gallium nitride, aluminum indium nitride, and indium gallium nitride.

12. The method of claim 9, further including forming a crystal transition layer between the gallium nitride layer and the polarization layer.

13. The method of claim 12, wherein forming the crystal transition layer comprises forming the crystal transition layer from a material selected from the group consisting of indium nitride and aluminum nitride.

14. The method of claim 9, further including forming a gate-to-drain length between about 120 nm to about 400 nm and forming a gate-to-source length between about 5 nm to about 400 nm.

15. The method of claim 14, wherein the gate-to-drain length is greater than the gate-to-source length.

16. A wireless power/charging device transmission module, comprising:
   a coil assembly; and
   a transmitter, wherein the transmitter includes at least one n-channel gallium nitride transistor, comprising:
      a gallium nitride layer;
      a source structure and a drain structure formed in the gallium nitride layer;
      a charge inducing layer comprising a polarization layer extending between the source structure and the drain structure; and
      a gate electrode extending at least partially into the polarization layer.

17. The wireless power/charging device transmission module of claim 16, wherein a thickness of a portion of the polarization layer which is between the gate electrode and the gallium nitride layer is less than about 1nm.

18. The wireless power/charging device transmission module of claim 16, further comprising a gate dielectric disposed between the gate electrode and the polarization layer.

19. The wireless power/charging device transmission module of claim 16, further comprising a portion of the polarization layer which is between the gate electrode and the gallium nitride layer is between about 5 nm and 10 nm.

20. The wireless power/charging device transmission module of claim 16, further including a crystal transition layer disposed between the gallium nitride layer and the polarization layer.

21. A wireless power/charging device receiving module, comprising:
- a coil assembly;
- a rectifier; and
- a load unit including a voltage regulator and a battery, wherein the voltage regulator includes at least one n-channel gallium nitride transistor, comprising:
  - a gallium nitride layer;
  - a source structure and a drain structure formed in the gallium nitride layer;
  - a charge inducing layer comprising a polarization layer extending between the source structure and the drain structure; and
  - a gate electrode extending at least partially into the polarization layer.

22. The wireless power/charging device receiving module of claim 21, wherein a thickness of a portion of the polarization layer which is between the gate electrode and the gallium nitride layer is less than about 1nm.

23. The wireless power/charging device receiving module of claim 21, further comprising a gate dielectric disposed between the gate electrode and the polarization layer.

24. The wireless power/charging device receiving module of claim 21, further comprising a portion of the polarization layer which is between the gate electrode and the gallium nitride layer is between about 5 nm and 10 nm.

25. The wireless power/charging device receiving module of claim 21, further including a crystal transition layer disposed between the gallium nitride layer and the polarization layer.

* * * * *